(12) United States Patent
Mes

(10) Patent No.: US 7,274,738 B2
(45) Date of Patent: Sep. 25, 2007

(54) SYSTEM FOR IMPROVING PERFORMANCE OF COMPRESSION AND DECOMPRESSION ALGORITHMS IN A TELECOMMUNICATION SYSTEM

(75) Inventor: Ian Mes, Nepean (CA)

(73) Assignee: CIENA Corporation, Linthicum, MD (US)

( * ) Notice: Subject to any disclaimer, the term of this patent is extended or adjusted under 35 U.S.C. 154(b) by 740 days.

(21) Appl. No.: 10/386,910

(22) Filed: Mar. 11, 2003

(65) Prior Publication Data
US 2003/0229489 A1    Dec. 11, 2003

(30) Foreign Application Priority Data
Mar. 11, 2002    (CA) ................................... 2375815

(51) Int. Cl.
*H04B 1/66*    (2006.01)
(52) U.S. Cl. ................. 375/240; 375/240.25; 704/200; 704/500; 704/501; 704/502; 704/503; 348/14.13
(58) Field of Classification Search ................ 375/240, 375/240.25, 240.05; 704/200, 500–504; 348/14.13
See application file for complete search history.

(56) References Cited

U.S. PATENT DOCUMENTS

| 4,718,057 | A |   | 1/1988 | Venkitakrishnan et al. |
|---|---|---|---|---|
| 5,005,150 | A |   | 4/1991 | Dent et al. |
| 5,883,925 | A | * | 3/1999 | Sinibaldi et al. ............. 375/241 |
| 6,421,744 | B1 | * | 7/2002 | Morrison et al. ............. 710/22 |
| 2004/0025000 | A1 | * | 2/2004 | Wise et al. .................. 712/300 |

* cited by examiner

*Primary Examiner*—Curtis Odom
(74) *Attorney, Agent, or Firm*—Merek, Blackmon & Voorhees, LLC

(57) ABSTRACT

In a telecommunications system, an arithmetic logic unit (ALU) that receives an input signal. The input signal includes a digital signal representative of an analog signal. The ALU selectively performs compression and decompression on the digital signal. The ALU comprises the following elements. A standard ALU component performs standard ALU operations on the input signal. An encoding unit selectively performs compression on the digital signal. A decoding unit selectively performs decompression on the digital signal. An instruction decoder receives and decodes an ALU instruction. An output selector selects a result from one of the standard ALU component, the encoding unit, and the decoding unit in accordance with the decoded instruction and provides the result as an output.

20 Claims, 1 Drawing Sheet

SYSTEM FOR IMPROVING PERFORMANCE OF COMPRESSION AND DECOMPRESSION ALGORITHMS IN A TELECOMMUNICATION SYSTEM

BACKGROUND OF THE INVENTION

The present invention relates generally to telecommunication systems and specifically to a system for minimizing the number of processor cycles required for implementing compression and decompression algorithms, while maintaining flexibility.

In a telecommunication system, a voice signal is sampled by an analog to digital converter. Data output from the converter is a linear representation of the voice signal. The linear data is typically encoded using a compression algorithm, such as µ-Law or A-Law. µ-Law is a Texas Instruments (TI) standard algorithm describing nonlinear compression performed in an analog-to-digital conversion of pulse code modulated (PCM) systems used in the U.S.A., Canada, and Japan. A-Law is a Conference for European Postal and Telecommunications administrations (CEPT) standard algorithm describing non-linear compression performed in an analog-to-digital conversion of PCM systems used in Europe and most other countries. The encoded data is transmitted across a network. At a receiving end of the network, the data is decoded. The decoded signal is passed through a digital-to-analog converter to generate an analog voice signal.

Typically, the µ-law and A-law encoder and decoder algorithms are implemented in either hardware or software. A first solution is to implement the algorithms as a hardware block in a datapath. Thus, all data going through the datapath is either encoded or decoded. While such an approach is efficient, it is inflexible and, thus, inappropriate for some systems.

An alternate solution is to implement the algorithms using software, or on a processor, to allow increased flexibility as compared to the hardware solution. However, the algorithms can consume a large number of processor cycles, especially if a processor is servicing many different channels. While such as approach is flexible, it is time consuming and, thus, inappropriate for some systems.

Yet an alternate solution is to implement the algorithms using standalone hardware blocks, accessible to the processor through its memory or input/output interface. However, these interfaces tend to be slower than internal processor operations. Thus, while such a solution can be an improvement over the previous solutions, it can still consume a significant number of processor cycles.

Therefore, there is a need for a system that implements the compression and decompression algorithms and provides flexibility, while reducing the required number of processor cycles. It is an object of the present invention to obviate or mitigate at least some of the above-mentioned disadvantages.

BRIEF SUMMARY OF THE INVENTION

In accordance with an aspect of the present invention, there is provided an arithmetic logic unit (ALU) for performing compression and decompression on at least one input signal. The ALU comprises the following elements. A standard ALU component performs standard ALU operations on at least one of the input signals. An encoding unit performs compression on at least one of the input signals. A decoding unit performs decompression on at least one of the input signals. An instruction decoder receives and decodes an ALU instruction. An output selector selects a result from one of the standard ALU component, the encoding unit, and the decoding unit in accordance with the decoded instruction and provides the result as an output.

BRIEF DESCRIPTION OF THE DRAWINGS

An embodiment will now be described by way of example only, with reference to the following drawing in which.

DETAILED DESCRIPTION OF THE INVENTION

Figure 1:
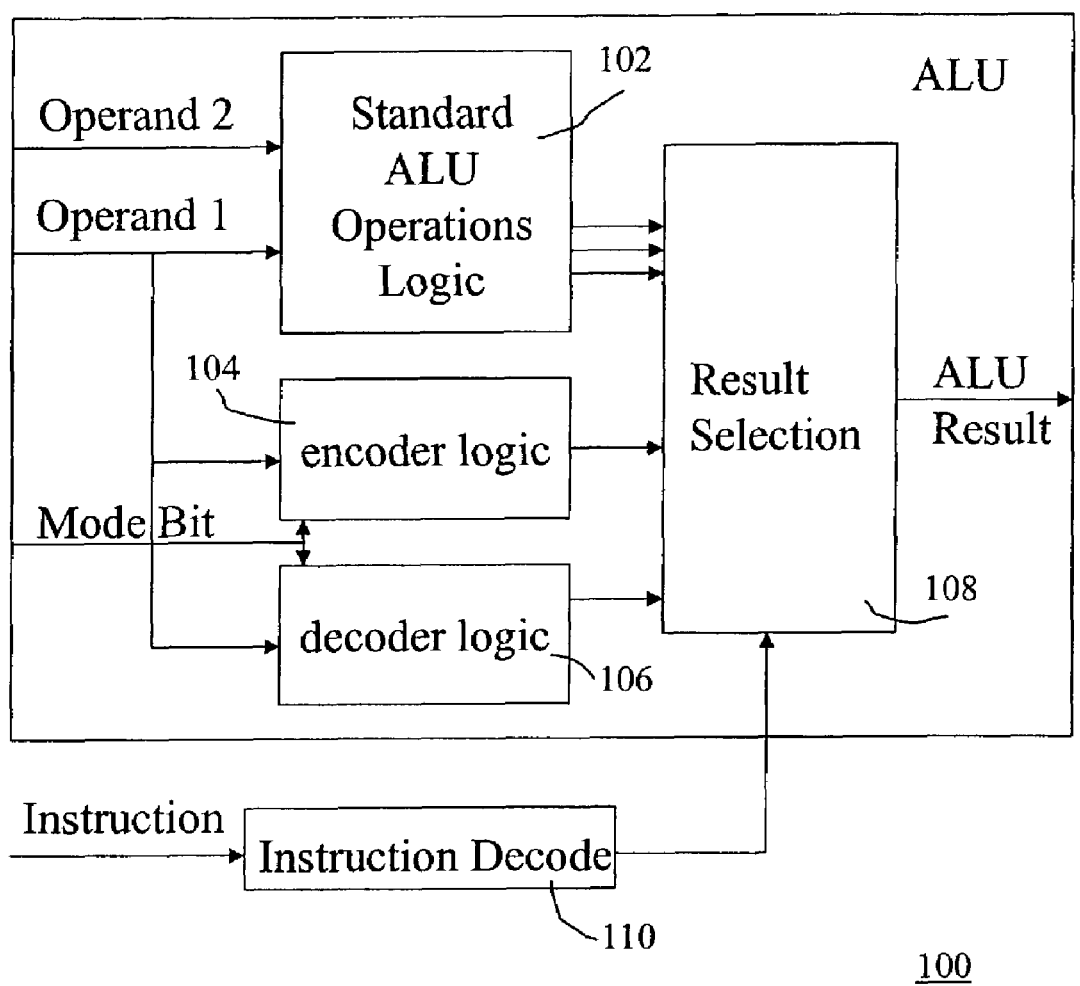
FIG. 1 is a block diagram of and arithmetic logic unit (ALU) including encoding and decoding capabilities.

For convenience, like numerals in the description refer to like structures in the drawings. An arithmetic logic unit (ALU) of a processor is a part of the processor that performs the arithmetic or logical functions of an instruction. For example, for an addition instruction the ALU adds two operands together and provides their sum as a result. Generally, other parts of the processor decode instructions, retrieve input operands, and write the result.

Adding µ-Law and/or A-law encoder and decoder instructions to a processor allows the encoding and decoding to be part of a software solution while consuming a minimal number of processor cycles. This is true because the ALU is embedded within the processor. Thus, the processor does not need to access an encoder or decoder unit through either memory or an input/output interface.

Referring to FIG. 1, an ALU in accordance with an embodiment of invention is illustrated generally by numeral 100. The ALU 100 comprises a standard ALU operations logic block 102, an encoder 104, a decoder 106, a result selector 108, and an instruction decoder 110. A first operand Operand1 and a second operand Operand2 are input to the standard ALU operations logic block 102 as is common in the art. The first operand Operand1 is further input to the encoder 104 and decoder 106. The output of the standard ALU operations logic block 102, encoder 104, and decoder 106 are input to the result selector 108. A mode indicator is a further input to the encoder 104 and decoder 106. The instruction decoder 110 is used for decoding an input instruction and selecting a result from the standard ALU operations logic block 102, the encoder 104, or the decoder 106.

The standard ALU operations logic block 102 consists of arithmetic and logical functions that are standard on state of the art processors. Generally, it has two operands Operand1 and Operand2 as inputs, although some of the ALU operations may use only a single operand. These operands are specified by the instructions and are retrieved by other parts of the processor, prior to the instruction reaching the ALU. The processor retrieves the operands from registers or memory. The standard ALU block 102 performs various arithmetic and logical functions on the operands and provides a plurality of results accordingly.

Similarly, the encoder 104 accepts a single operand input and generates a single result as an output. The mode indicator selects which of the µ-Law or A-Law encoding algorithms is to be used. Thus, for the present embodiment the mode indicator need only be one bit wide. The encoder 104 comprises a µ-Law encoder and an A-Law encoder, both meeting International Telecommunication Union—Telecommunication Standardization Sector (ITU-T) G.711 Specification.

The decoder 106 also accepts a single operand input and generates a single result as an output. The mode indicator selects which of the µ-Law or A-Law decoding algorithms is to be used. The decoder 106 comprises a µ-Law decoder and an A-Law decoder, both meeting the ITU-T G.711 Specification.

The instruction decoder 110 receives the instruction as its input, decodes the instruction and provides the decoded instruction to the result selector 108. If the instruction decoder 110 logic is simple it can be embedded within the result selector 108 itself.

The result selector 108 multiplexes results from the standard ALU operations logic 102, the encoder 104 and the decoder 106. The result selector uses the decoded instruction for selecting a desired result, thus generating a single ALU result. The selection of the ALU result is a similar mechanism that is used to select between the standard ALU arithmetic instructions. The selection circuitry is expanded to include instructions for encoding and decoding. The ALU result can be written to a register or a memory location. The target destination of the result is specified in the instruction. The result is generally written to its destination by another portion of the processor.

Not shown on this diagram are flags. Flags may be generated by most ALU operations. A flag is a single bit that checks for a particular condition in the result. For example, a zero flag will check if the result is zero, whereas a negative flag will check if the result if negative. In the present embodiment, flags may be generated for each ALU operation and may be multiplexed in the same way as the results. The encode and decode operations do not affect the flags. Therefore, when one of these instructions is selected, the previous flags are multiplexed into the output ALU flags, thereby re-writing the same value back into the flag registers.

The instruction is an element of the program code that the processor is executing. It defines the ALU operation that is to be executed. It also defines where the input operands are to be retrieved and where the output ALU result are to be stored. An instruction can also contain other information that affects the execution of the instruction. Thus, in addition to the encoder 104 and decoder 106, new instructions are added to the ALU in order to affect their use.

The encoder 104 and decoder 106 are evoked using corresponding instructions, encode and decode. These instructions are represented as law_enc and law_dec. The mode indicator determines whether to use the µ-Law or A-Law algorithm for encoding and decoding. For example, if the mode indicator is set to "1", µ-Law encoding is performed; if the mode is set to "0", A-Law encoding is performed. Alternately, for example, if the mode indicator is set to "0", µ-Law encoding is performed; if the mode is set to "1", A-Law encoding is performed. In the present embodiment, the mode indicator is stored in a register internal to the processor. However, how this bit is implemented depends on the processor used. In this particular implementation, the bit is stored in an auxiliary register, which is an address space that is independent of the memory address space.

The encode instruction law_enc is encoded as<law_enc dest, src>, where 'dest' is a destination address and 'src' is a source address. That is, 'src' is a location from which to fetch the input operand Operand1 for the encode instruction law_enc, and 'dest' is a location where the result of the encode instruction law_enc should be stored. Thus, according to one embodiment, the instruction takes a word of linear data and returns an encoded byte. The word is encoded either by the µ-Law or the A-Law algorithm, depending on the state of the mode indicator.

The decode instruction law_dec is encoded as<law_dec dest, src>, where 'dest' is the destination address and 'src' is the source address. According to one embodiment, the instruction takes an encoded byte of data and returns a decoded word. The byte is decoded either by the µ-Law or the A-Law algorithm, depending on the state of the mode indicator.

The encode instruction law_enc and decode instruction law_dec are built like the other arithmetic instructions. The input operand is the same input operand used as an input to other instructions. While some of the other arithmetic operations will use two operands, the law_enc and law_dec only require a single operand. The output is selected as the ALU result when the law_enc or law_dec instructions are executed. The selection of the ALU result is the same mechanism that is used to select between the standard ALU arithmetic instructions. The selection circuitry is simply expanded to include the law_enc and law_dec instructions.

In an alternate embodiment, four instructions can be used to represent the instructions instead of two instructions and a mode indicator. This embodiment is useful if a mix of the two algorithms is needed. In such an embodiment, there may be two encoders and two decoders, one for each of the µ-Law and A-Law encode and decode algorithms. Thus, each instruction selects a result from a corresponding decoder or encoder, and the mode indicator is not required.

In another embodiment, encoder and decoder units from the first embodiment are implemented, and instructions are used to toggle the mode indicator depending on whether the µ-Law or A-Law algorithm is desired.

In yet another embodiment, the mode indicator includes a plurality of bits for allowing more than two algorithms to be selected. In such an embodiment, the encoder and decoder can include several algorithms, which allows for the inclusion of potential future algorithms.

Although the invention has been described with reference to certain specific embodiments, various modifications thereof will be apparent to those skilled in the art without departing from the spirit and scope of the invention as outlined in the claims appended hereto.

What is claimed is:

1. In a telecommunications system, an arithmetic logic unit (ALU) for processing at least one input signal, said at least one input signal including a digital signal representative of an analog signal, said ALU comprising:

a standard ALU component for performing standard ALU operations on said at least one input signal;

an encoding unit for selectively performing compression on said digital signal;

a decoding unit for selectively performing decompression on said digital signal;

an instruction decoder for receiving and decoding an ALU instruction;

an output selector in parallel communication with each of said standard ALU, said encoding unit, and said decoding unit for receiving results from each of said standard ALU, said encoding unit, and said decoding unit; and said output selector including circuitry for receiving an instruction from said ALU, interpreting said ALU instruction, and for selecting a result from one of the received result from said standard ALU, said encoding unit, and said decoding unit according to the received instruction from said ALU.

2. An ALU as defined in claim 1, wherein said encoding unit and said decoding unit are capable of selectively performing compression and decompression in accordance with a plurality of different algorithms.

3. An ALU as defined in claim 2, wherein one of said plurality of different algorithms is selected for performing compression and decompression.

4. An ALU as defined in claim 3 further comprising:
a mode indicator for selecting said one of said plurality of different algorithms.

5. An ALU as defined in claim 4, wherein an instruction is provided for setting said mode indicator.

6. An ALU as defined in claim 1, wherein said encoding unit and said decoding unit are identified by unique instructions.

7. An ALU as defined in claim 1, further comprising:
a plurality of encoding units; and
a plurality of decoding units,
wherein one of said plurality of encoding units and one of said plurality of decoding units is provided for each of a plurality of different compression and decompression algorithms, respectively.

8. An ALU as defined in claim 7, wherein each of said plurality of encoding units and each of said plurality of decoding units is identified by a unique instruction, respectively.

9. An ALU as defined in claim 2, wherein one of said plurality of different algorithms is μ-Law.

10. An ALU as defined in claim 2, wherein one of said plurality of different algorithms is A-Law.

11. An ALU as defined in claim 7, wherein one of said plurality of different compression and decompression algorithms is μ-Law.

12. An ALU as defined in claim 7, wherein one of said plurality of different compression and decompression algorithms is A-Law.

13. An ALU as defined in claim 1, including a multiplexer for generating a multiplexed signal from an output from each of said standard ALU, said encoding unit, and said decoding unit and for providing said multiplexed signal as input into said output selector.

14. In a telecommunications system, a method for processing at least one input signal, said at least one input signal including a digital signal representative of an analog signal, said method comprising the steps of:
performing standard arithmetic logic unit (ALU) operations on said at least one input signal and generating a first result;
selectively performing compression on said digital signal and generating a second result;
selectively performing decompression on said digital signal and generating a third result;
receiving and decoding an ALU instruction; and matching said decoded ALU instruction to an associated one of said first result, said second result and said third result in accordance with said ALU instruction and providing the matched result as an output.

15. A method as defined in claim 14, wherein compression and decompression are selectively performed in accordance with a plurality of different algorithms.

16. A method as defined in claim 15, wherein one of said plurality of different algorithms is selected for performing compression and decompression.

17. A method as defined in claim 16, wherein said one of said plurality of different algorithms is selected via a mode indicator.

18. A method as defined in claim 14, wherein said steps of performing standard arithmetic logic unit (ALU) operations, said selectively performing compression, and selectively performing decompression are performed in parallel with each other and wherein the only output provided are matched results.

19. In a telecommunications system, a method for processing at least one input signal, said at least one input signal including a digital signal representative of an analog signal, said method comprising the steps of:
performing standard arithmetic logic unit (ALU) operations on said at least one input signal and generating a first result;
selectively performing compression on said digital signal and generating a second result;
selectively performing decompression on said digital signal and generating a third result;
receiving and decoding an ALU instruction; and
receiving said first result, said second result and said third result in parallel in an output selector;
selecting a final result from one of said received first result, said received second result and said received third result in accordance with said ALU instruction and subsequently providing only said final result as an output of said output selector.

20. A method as defined in claim 19, wherein said first result, said second result and said third result are received in said output selector as a multiplexed signal containing each of said first result, said second result and said third result.

* * * * *